US 7,605,066 B2

(12) United States Patent
Cerofolini et al.

(10) Patent No.: US 7,605,066 B2
(45) Date of Patent: Oct. 20, 2009

(54) METHOD FOR REALIZING AN ELECTRIC LINKAGE IN A SEMICONDUCTOR ELECTRONIC DEVICE BETWEEN A NANOMETRIC CIRCUIT ARCHITECTURE AND STANDARD ELECTRONIC COMPONENTS

(75) Inventors: Gianfranco Cerofolini, Milan (IT); Danilo Mascolo, Ercolano (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 356 days.

(21) Appl. No.: 11/482,513

(22) Filed: Jul. 7, 2006

(65) Prior Publication Data

US 2007/0038966 A1 Feb. 15, 2007

(30) Foreign Application Priority Data

Jul. 8, 2005 (EP) .................................. 05425489

(51) Int. Cl.
*H01L 21/20* (2006.01)
(52) U.S. Cl. ............... 438/584; 438/637; 257/E21.023; 257/E23.141; 977/762
(58) Field of Classification Search ......... 438/584–688; 257/773, E23.141, E21.495, E23.152, E21.023, 257/E21.582; 977/762
See application file for complete search history.

(56) References Cited

U.S. PATENT DOCUMENTS

| | | | | |
|---|---|---|---|---|
| 4,994,410 A * | 2/1991 | Sun et al. ..................... 438/649 |
| 5,963,827 A * | 10/1999 | Enomoto et al. ............. 438/629 |
| 6,128,214 A | 10/2000 | Kuekes et al. ................ 365/151 |
| 6,256,767 B1 | 7/2001 | Kuekes et al. ................... 716/9 |
| 6,268,657 B1 * | 7/2001 | Watanabe et al. ........... 257/759 |
| 6,548,881 B1 | 4/2003 | Blish et al. .................. 257/499 |
| 6,984,294 B2 * | 1/2006 | Friedemann et al. ... 204/192.22 |
| 7,230,286 B2 * | 6/2007 | Cohen et al. ................. 257/210 |
| 2003/0085439 A1 | 5/2003 | Gudesen et al. ............. 257/421 |
| 2005/0052894 A1 | 3/2005 | Segal et al. ................. 365/129 |

OTHER PUBLICATIONS

Michael D. Austin et al., "6 nm half-pitch lines and 0.04 μm² static random access memory patterns by nanoimprint lithography," *Nanotechnology*, vol. 16 (2005), pp. 1058-1061.

(Continued)

*Primary Examiner*—Khiem D Nguyen
(74) *Attorney, Agent, or Firm*—Lisa K. Jorgenson; E. Russell Tarleton; Seed IP Law Group PLLC

(57) ABSTRACT

A method realizes an electric connection between a nanometric circuit and standard electronic components. The method includes: providing, above a semiconductor substrate, a seed having a notched wall substantially perpendicular to the substrate, the wall having n recesses spaced apart from one another; and realizing n conductive nanowires alternated with insulating nanowires. Each realization of a conductive nanowire fills a corresponding recess by a respective elbow-like portion of the conductive nanowire, and partially fills the other recesses by respective notched profile portions, thereby forming the nanometric circuit. The method forms, above the nanometric circuit, an insulating layer; opens, in the insulating layer, n windows respectively corresponding with the recesses, thereby exposing the respective elbow-like portions; and realizes, above the insulating layer, n conductive dies addressed towards the standard electronic components and respectively overlapping the windows, thereby forming n contacts realizing the electric connection.

27 Claims, 7 Drawing Sheets

OTHER PUBLICATIONS

G.F. Cerofolini et al., "A hybrid approach to nanoelectronics," *Nanotechnology*, vol. 16 (2005), pp. 1040-1047.

André DeHon et al., "Stochastic Assembly of Sublithographic Nanoscale Interfaces," *IEEE Transactions on Nanotechnology*. vol. 2, No. 3, Sep. 2003, pp. 165-174.

Nicholas A. Melosh et al., "Ultrahigh-Density Nanowire Lattices and Circuits," *Science*, vol. 300, Apr. 4, 2003, pp. 112-115.

Sachin R. Sonkusale et al., "Fabrication of wafer scale, aligned sub-25 nm nanowire and nanowire templates using planar edge defined alternate layer process," *Physica E*, vol. 28 (2005), pp. 107-114.

\* cited by examiner

METHOD FOR REALIZING AN ELECTRIC LINKAGE IN A SEMICONDUCTOR ELECTRONIC DEVICE BETWEEN A NANOMETRIC CIRCUIT ARCHITECTURE AND STANDARD ELECTRONIC COMPONENTS

BACKGROUND OF THE INVENTION

1. Field of the Invention

The present invention relates, in its most general aspect, to the field of electronic circuits and in particular to the field of the electronic circuits comprising components of nanometric sizes.

More specifically, the present invention relates to a method for realizing, in a circuit of the above type, a plurality of electric contacts between elements of nanometric sizes (nanowires) defining the above circuit architectures of a nano-area, and standard electronic components of a micro-area.

2. Description of the Related Art

In such field, an electronic circuit integrated in a semiconductor device can be schematically represented by one or more micrometric regions, or micro-areas, interacting with one or more nanometric regions or nano-areas.

A micro-area comprises, or is defined by, so called standard electronic components such as, for example, capacitor diodes, MOSFET transistors, address devices, logic and memory devices, micro-contacts, or portions thereof.

The sizes of such standard electronic components, usually micrometric or sub-micrometric, depend, in the last analysis, on the wavelength of the photolithographic source employed in their realization, usually not lower than 90 nm.

A nano-area comprises in turn, or is defined by, circuit architectures of nanometric sizes obtained, for example, by means of electronic lithography (e-beam lithography), with S"PT technique (Multi-Spacer Patterning Technology) or by means of imprint lithography (in all the possible versions: Soft Lithography, Nano-Imprint Lithography, Step-and-Flash Imprint Lithography, and Superlattice Nanowire Pattern).

A nano-area can possibly comprise, moreover, housed in such nanometric circuit architectures, molecular devices realized through chemical synthesis, i.e. molecules able to perform specific functions of mechanical, electric or optic nature.

As it is known, in the electronics field, the need of realizing circuit configurations of more and more reduced sizes is particularly felt.

Actually, the advent of constantly more refined technologies has allowed the miniaturization of the circuit architectures and, in consequence, a greater density thereof in the semiconductor electronic devices.

For example, it has been possible to realize, by means of non-photolithographic techniques, arrays of nanowires having a pitch in the order of a few tens of nanometers (circa 30 nm), or still crossbar architectures of nanowires having a density of intersection points of about $10^{11}$ cm$^{-2}$.

Some examples of such embodiments are reported in the publication by N. A. Melosh, A. Boukai, F. Diana, B. Gerardot, A. Badolato, and J. R. Heath, "Ultra High Density Nanowire Lattices and Circuits", Science 300, 112 (2003), and in that by M. D. Austin, W. Zhang, H. Ge, D. Wasserman, S. A. Lyon and S. Y. Chou, "6 nm half-pitch lines and 0.04 μm2 static random access memory patterns by nanoimprint lithography", Nanotechnology, 16 (2005). A further embodiment is disclosed in the U.S. Pat. No. 6,128,214 by P J. Kuekes et al.

However, although currently the capacity to obtain nanometric architectures having the above sizes is widespread, the realization of semiconductor devices comprising such architectures has mainly interested, up to now, the experimental aspect.

The substantial absence of a production of such electronic devices on an industrial scale, is mainly due to the difficulty of relating nanometric architectures to standard electronic components, i.e. of realizing a connection interface between nano-area and micro-area of the electronic device.

Although some methods have been developed for the realization of the above connection, as it is reported, for example, in the U.S. Pat. No. 6,256,767 by Kuekes et al. and in the publication by A. DeHon, P. Lincoln and J. E. Savagein, "Stochastic assembly of sub-lithographic nanoscale interfaces", IEEE Trans. On Nanotec. 2 (3), 165174, (September 2003), such methods are not reliable and industrially profitable.

It would be thus desirable to have a method at disposal for realizing an electric connection between standard electronic components of a micro-area and nanometric electronic components of a nano-area, which is particularly simple, reliable and in line with the currently used technology for realizing circuit configurations of more and more reduced sizes.

Such a method would allow an industrialization on a large scale of high density integrated electronic circuits in a semiconductor substrate.

BRIEF SUMMARY OF THE INVENTION

One embodiment of the present invention provides a method for realizing, in an integrated electronic device of the above considered type, an electric connection between a nanometric circuit architecture and standard electronic components which overcomes the above drawbacks and those still affecting the methods according to the prior art.

The characteristics and the advantages of the method according to the present invention will be apparent from the following description of some embodiments given by way of indicative and non-limiting example with reference to the annexed drawings.

DETAILED DESCRIPTION OF THE INVENTION

Figure 1:
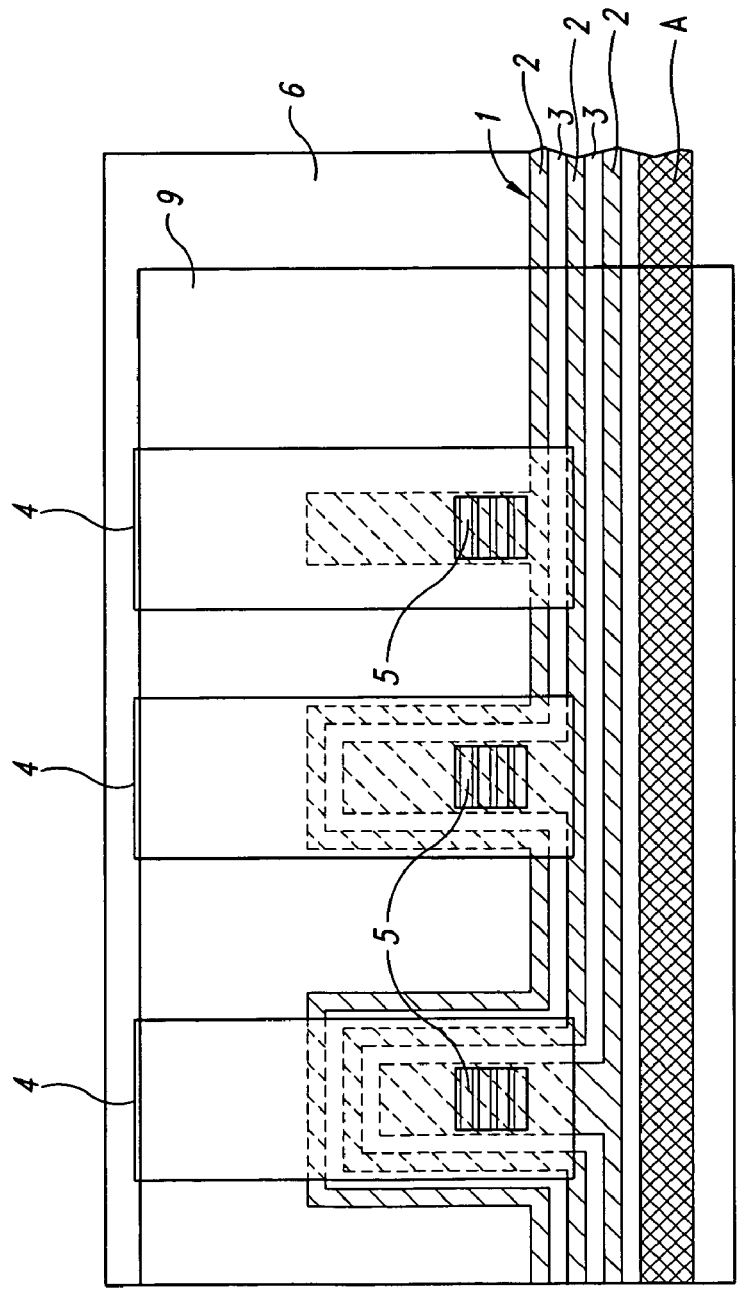
FIG. 1 schematically shows a plan and partially section view of a portion of a semiconductor electronic device comprising an electric connection between a nanometric circuit architecture and standard electronic components, realized with the method according to one embodiment of the invention.

The here described steps do not form a complete flow of a method for realizing an electric connection in a semiconductor electronic device between a nanometric circuit architecture and standard electronic components and only those steps needed by an average technician of the field for the comprehension of the invention are hereafter described.

It is important to note, moreover, that the figures represent schematic views of portions of an electronic circuit integrated in a semiconductor device during some steps of a method according to one embodiment of the invention, and they are not drawn to scale, but, on the contrary, realized in such a way as to stress the characteristics of one embodiment of the invention.

The present invention can be implemented by using several techniques usually used in the manufacturing of semiconductor electronic devices, in particular all the lithographic methodologies (optical lithography, UV, EUV, electronic, ionic, imprint) and the Multi Spacer Patterning Technology (S"PT).

In particular, this latter technology is employed to realize nanowires of a nanometric circuit architecture, which is electrically connected to standard electronic components of a micro-area.

Although known, for a better comprehension of the invention, the peculiar aspects of the S"PT through which, advantageously, it is possible to realize the above nanometric circuit architectures with extreme precision and control are hereafter briefly summarized.

More in particular it is possible to realize circuit architectures comprising arrays of high density nanowires in the semiconductor device.

The S"PT (reiteration of the Space Patterning Technique SPT) is a technique which allows to transform the thickness of a thin layer of a predetermined material (vertical dimension), deposited on a substrate, into the width of a spacer or more generically of a nanowire, of the same material (horizontal dimension).

Such technique exploits the possibility of controlling, in a more precise way, the thickness of the deposited layer, as well as the capacity that a lot of materials have to adapt uniformly to the topography underlying them.

The possibility of transforming a vertical dimension or extension into a horizontal one is allowed by the initial use of a seed (sacrificial layer), provided with at least a vertically extended wall, whereon the material is deposited.

Further to an anisotropic etching of the deposited layer the nanowire, adjacent to the above vertical wall, is obtained comprising in turn a vertically extended wall, wherefrom, by reiterating the process, further nanowires can be obtained.

Finally, the capacity of selectively removing different materials allows to obtain, subsequently to further controlled depositions and anisotropic etchings, variously complex structures.

In practice, it is possible to realize a circuit architecture wherein only one dimension depends on the photolithography, whereas the remaining two dimensions (width and height of the nanowire) are obtained by controlling the thickness of the deposited layer, even within a few nanometers.

Deposited layer, as it is known herein, means a layer obtained both by means of a real controlled deposition of the material, for example with "CVD oxide" (Control Vapor Deposition), and by means of the growth of the material from the underlying layer, for example by means of "Thermal Oxidation".

Now, with reference to the above figures, A indicates a portion of a substrate of a semiconductor device whereon an integrated circuit is realized.

In detail, on the substrate A there is a nanometric circuit structure 1 comprising n conductive nanowires 2 (in the embodiment of the figures three conductive nanowires), arranged according to an ordered configuration, alternated with insulating nanowires 3 (FIG. 1). It should be appreciated that FIG. 1 is a plan and partially section view in that the substrate A is at a lower level than the nanowires 2, 3 which are formed on covered portions of the substrate A.

The above nanowires, and more generally the nanometric circuit architecture 1, constitute, or in the semiconductor electronic device are part of, a so called nano-area, which is electrically connected, through conductive dies 4, to standard electronic components, these latter being not shown in the figures.

The dies 4 in turn constitute, or with the above standard electronic components are part of, a so called micro-area of the semiconductor electronic device.

The electric connection between nano-area and micro-area is realized by a plurality of electric contact areas, or simply contacts 5, between the nanowires 2 and the dies 4.

Figure 2:
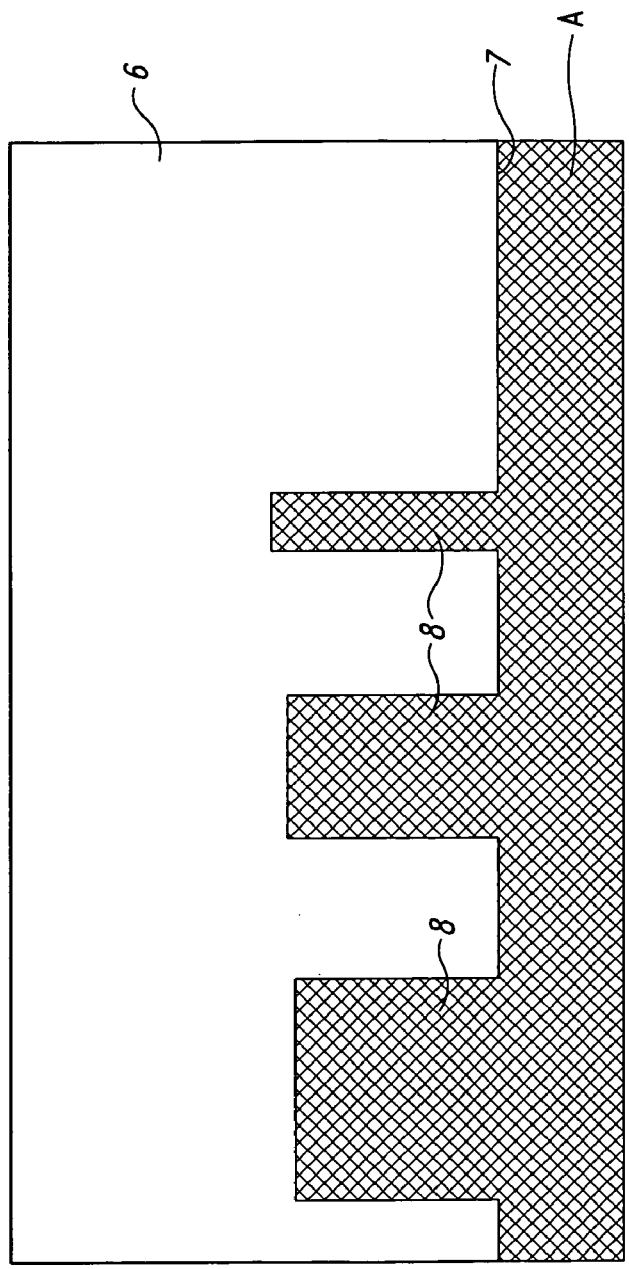
FIGS. 2 to 7 show a portion of a semiconductor electronic device during some steps of a method according to one embodiment of the invention with relevant enlarged details, for realizing the electric connection of FIG. 1.
Figure 3:
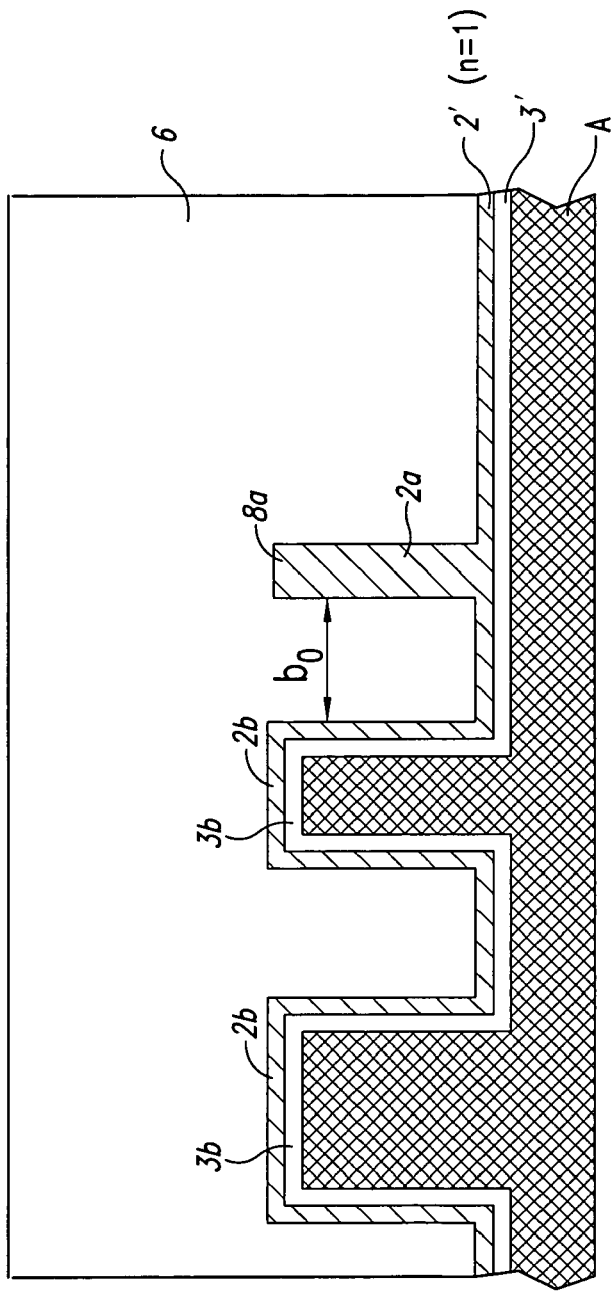

To obtain the contacts 5, the present method first provides the realization of the above n conductive nanowires 2 alternated with the insulating nanowires 3, which are obtained by means of the S"PT technique, starting from a seed layer 6 formed on the substrate A and having a vertical wall 7 extending upwardly from the substrate A, as shown in FIG. 2. The vertical wall 7 is crossed by n recesses 8 and is substantially perpendicular to the substrate A. The n recesses 8 can be formed in the seed layer 6 by any of the photolithographic techniques discussed above.

In particular, the recesses 8 extend towards the inside of the seed layer 6 for the whole vertical extension of the seed layer itself which, moreover, in correspondence with such vertical wall 7 has a notched, or comb-like, profile.

The recesses 8, preferably parallel to each other, are placed at a constant distance $b_0$ from one another, whereas the depth and the width of each nth recess are correlated with the thickness $t_{si}$ of the conductive nanowires 2 and with the thickness $(t_{sp}-t_{si})$ of the insulating nanowires 3 and are given by the relations $a_n \geq (n-1)t_{sp}+a_0$ and $b_n=2t_{si}+2(n-1)t_{sp}$ respectively, where $a_0$ is a constant dependant on the technique employed in the realization of the seed layer 6, as it will be more apparent hereafter in the description.

A first one 2' of the n conductive nanowires 2 is realized by first depositing a conductive layer, preferably polysilicon, on the substrate A and the seed layer 6, thereby also at least partially filling the recesses. Next, the conductive layer is anisotropically etched to remove the conductive layer from the horizontal surfaces of the seed layer 6 and substrate A, while leaving the first conductive nanowire 2' on the vertical surface 7 of the seed layer 6. After the anisotropic etching, the conductive layer also remains on the walls of the recesses 8. A first one 8a of the recesses 8 is made sufficiently narrow so that the anisotropic etching does not remove the conductive layer in the first recess 8a, thereby forming an elbow-like portion 2a in the first recess. The other recesses 8 are sufficiently wide such that notched profile portions 2b of the nanowire 2' remain in those recesses 8.

After the first conductive nanowire 2' is formed, a first one 3' of the n insulating nanowires 3 is formed in a similar manner as the first conductive nanowire 2'. A dielectric layer is first formed on the first conductive nanowire 2', the seed layer 6, and the substrate A and then anisotropically etched to leave the first insulating nanowire 3' on the outside vertical wall of the first conductive nanowire 2'. The first insulating nanowire 3' includes notched profile portions 3b formed on the vertical sidewalls of the notch profile portions 2b of the first conductive nanowire 2'. Preferably, the dielectric layer is a thermal silicon oxide layer that is thermally grown on the underlying layers such that the first insulating nanowire 3' is oxide.

Figure 4:
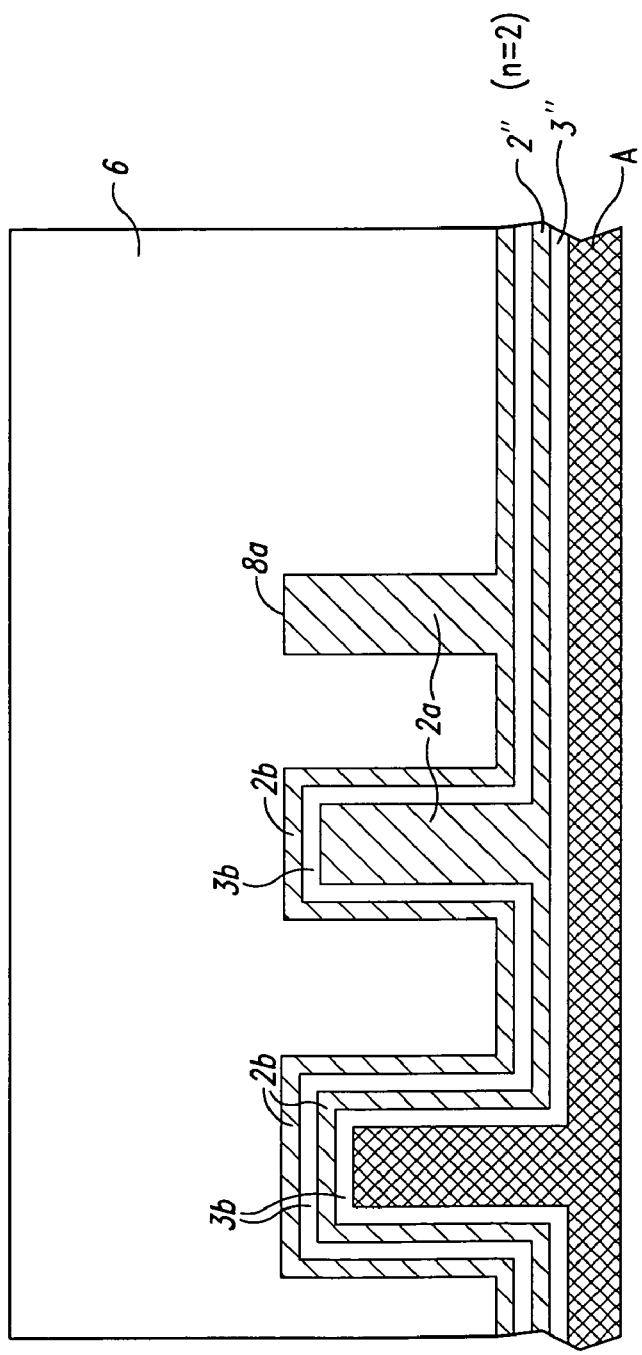
Figure 5:
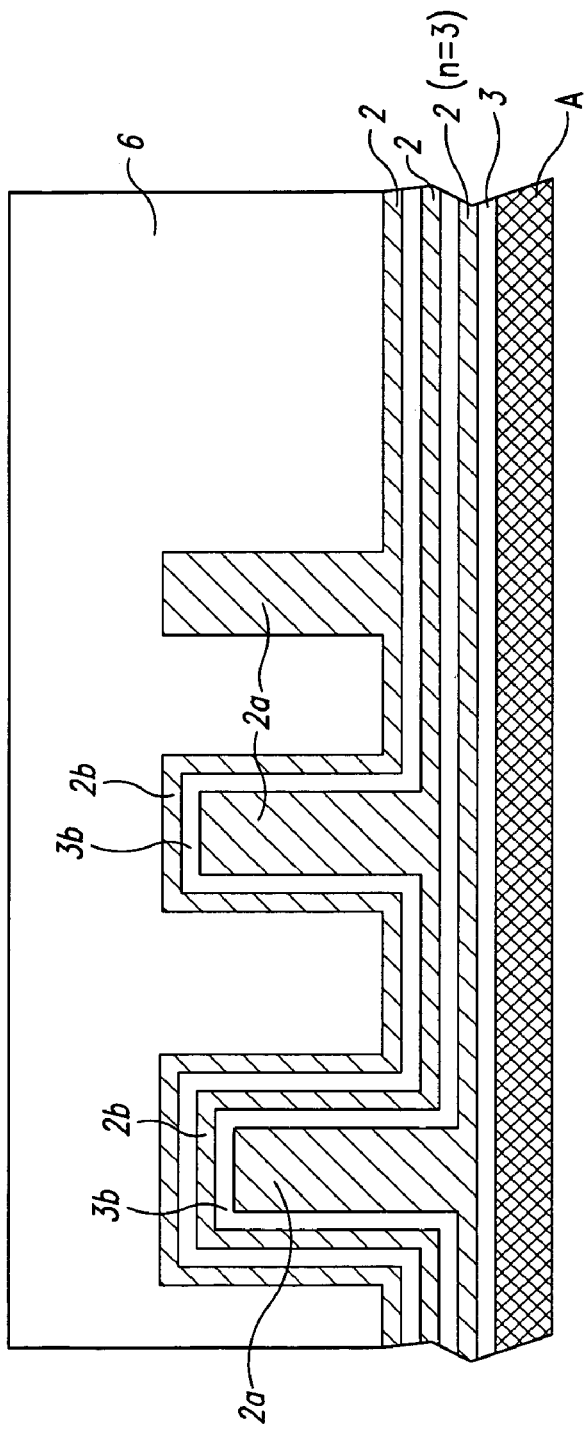
Figure 6:
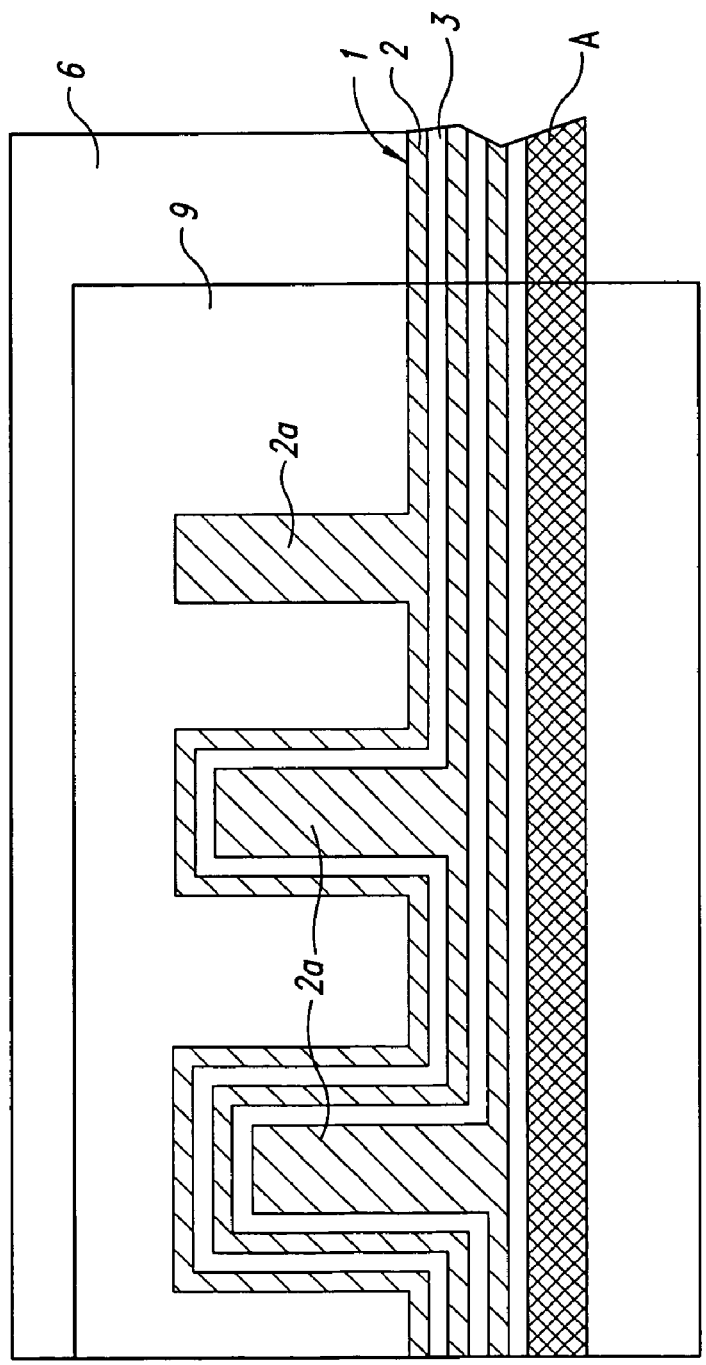
Figure 7:
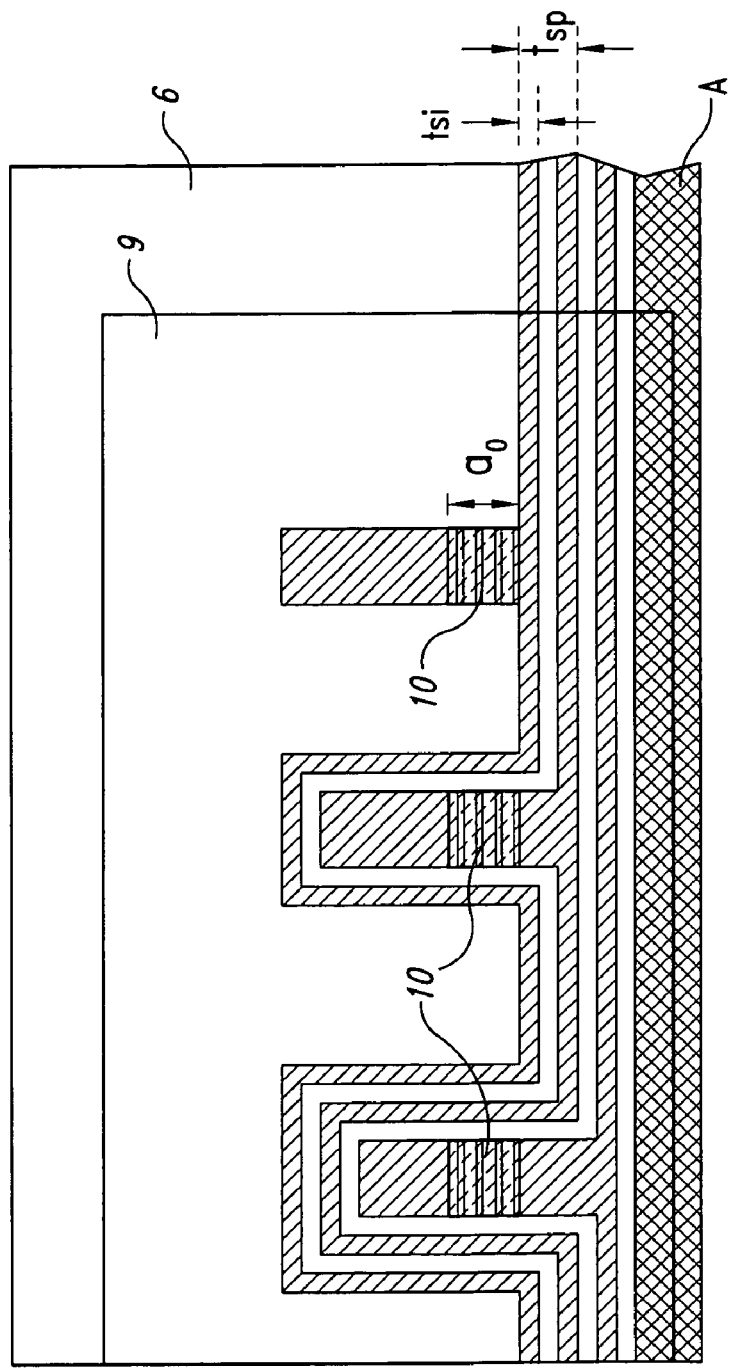

The S"PT technique repeats the above steps to form the remaining conductive nanowires 2 and insulating nanowires 3, as shown in FIGS. 4-5. The n conductive nanowires 2 are each thus realized with said thickness $t_{si}$ comprised between 5 nm and 60 nm preferably between 5 nm and 30 nm, by means of the controlled deposition, on the seed layer 6 and the substrate A, of a layer of conductive material having such thickness, preferably a polysilicon layer, followed by anisotropic etching of the deposited layer.

The formation of the conductive nanowires 2 is alternated with the realization of the insulating nanowires 3 obtained according to S"PT mode by growth of a thermal oxide from the conductive material, followed in any case by anisotropic etching of the insulating material.

Each insulating nanowire 3 is realized with said thickness $(t_{sp}-t_{si})$ wherein $t_{sp}$ is the width, or thickness, of a pair of consecutive conductive 2 and insulating 3 nanowires and is lower than 90 nm, preferably comprised in the range 10-50 nm.

In this way, i.e. meeting the above relations, the realization of a conductive nanowire 2 of order n implies, as effect, the completion of the filling of the corresponding nth recess 8 of width $b_n$.

Going on with the realization of the nanowires, as it can be seen in FIG. 4, it follows that for n=2 the realization of the second conductive nanowire 2" implies the completion of the filling of the recess 8 of second order by means of a respective elbow-like portion 2a, and a further partial filling, by means of respective portions with notched profile 2b, of the recesses 8 of greater order than the second. A second one 3" of the insulating nanowires 3 is then formed as discussed above on the vertical walls of the second conductive nanowire 2".

More in general, this mechanism is repeated at each realization of a conductive nanowire of a given order, with the effect of determining the filling or the completion of the filling of a recess 8 of the same order by means of a respective elbow-like portion 2a, and the partial filling together with the conductive 2 and insulating 3 nanowires of lower order, already realized, of the recesses 8 of greater order by means of respective notched profile portions 2b, 3b.

The above nanometric circuit architecture 1 is thus obtained, and then an insulating layer 9 is realized on the nanometric circuit architecture 1.

Such insulating layer 9 is preferably a silicon oxide layer whose thickness is comprised between 1 nm and 100 nm. However, for the realization of such layer also different materials can be employed such as, for example, silicon nitride and similar insulating materials.

At this point, n windows 10 are opened on the insulating layer 9, each window 10 being open essentially in correspondence with a respective one of the recesses 8 so as to expose part of the elbow-like portion 2a of the conductive nanowire 2 present in said recess.

In this way, each window 10 selectively exposes a conductive nanowire 2 in its elbow-like portion 2a which advantageously has a length longer than $t_{si}$, i.e. accessible by means of electronic lithography or other lithographic techniques of new generation.

The opening of the above windows 10 can be performed, for example, with electronic lithography in a conventional way, or by bombing the insulating layer 9 with an ionic beam according to the technology known as FIB.

In this respect, it is to be noted that for the selective opening of the windows 10 in correspondence with the respective elbow-like portions 2a of the conductive nanowires 2 is sufficient to align a mask with the seed layer 6 whose position is identified, said mask having respective openings suitably placed in relation to the predetermined distance $b_0$ between the recesses 8 of the seed 6, and suitably sized in relation to the width $a_0$ desired for the windows 10.

As previously remembered, $a_0$ is in turn linked to the technology used for realizing the seed layer 6 and preferably corresponds to the smallest size definable with said technology.

In particular, according to the technology used, $a_0$ is comprised between 2 nm and 60 nm, preferably between 5 nm and 20 nm, whereas $b_0$ is typically lower than 60 nm, preferably comprised between 10 nm and 30 nm.

At this point, on the insulating layer 9 in correspondence with the windows 10, the above conductive dies 4 are realized.

In detail, the dies 4 are realized in such a way as to overlap, in correspondence with the window 10, onto a respective exposed part of the elbow-like portion 2a of a conductive nanowire 2, with obtainment of the above contacts 5, and realization of the desired electric connection between nano-area and micro-area.

Moreover, it is to be said that the dies 4 are advantageously realized according to conventional methodologies by depositing, on the insulating layer 9 whereon the windows 10 have been opened, a layer of conductive material, this latter not shown in the figures, and by defining it by means of photolithography.

The conductive material can be doped polysilicon deposited by means of CVD techniques or metal deposited by means of PVD.

As regards the realization of the above seed layer 6, it can be obtained in a conventional way with various technologies, in particular with S"PT technique or with lithographic methods such as extreme ultraviolet lithography EUV, deep ultraviolet lithography DUV, electronic e-beam lithography and the imprint lithography in all its possible versions (Soft Lithography, Nano-Imprint Lithography, Step-and-Flash Imprint Lithography, and Superlattice Nanowire Pattern).

In synthesis, relatively to the cited lithographic techniques, on the above substrate A first a layer of sacrificial material is deposited (for example a nitride, an oxide etc.) and then a resist layer is deposited on said layer of sacrificial material. At this point the resist layer is defined by means of a mask according to the desired profile for the seed layer 6 by using one of the above technologies.

Then, the sacrificial material exposed by the above definition is removed, i.e. the portion is no longer masked by the resist, with obtainment of the seed layer 6.

With the present method, in practice, an electric connection is realized between the nano-area and the micro-area of the integrated electronic device by increasing the width or thickness of each nanowire in correspondence with respective elbow-like portions suitably spaced from one another and being selectively accessible.

In particular, the above increase makes the nanowires 2 singularly and directly accessible for the electric connection to standard electronic components, for example micro-contacts, by means of the techniques currently used in the realization of semiconductor electronic devices, employed for realizing the conductive dies 4.

The main advantage of the method described above lies in the possibility of selectively contacting high density conductive nanowires of a nanometric circuit architecture, whose width and whose distance are below the lowest limit attainable by means of lithography.

A further advantage lies in the simple realization of the method described above, which provides steps which can be easily integrated in the currently used manufacturing processes.

Moreover, the present method has revealed to be particularly profitable from the economic point of view.

Obviously, in order to meet contingent and specific requirements, a skilled in the art could bring several modifications to the above described invention, all however comprised within the scope of protection of the invention, as defined by the following claims.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

The invention claimed is:

1. A method for realizing an electric connection in a semiconductor electronic device between a nanometric circuit architecture and standard electronic components, the method comprising the steps of:
    a) providing, above a semiconductor substrate, a seed layer having at least a notched wall substantially perpendicular to said substrate, said wall defining n vertical recesses having a height equal to a thickness of said seed layer, said recesses being placed at a distance $b_0$ from one another and having depth $a_n$ and width $b_n$;
    b) realizing, by Multi-Spacer Patterning Technology (S"PT), n conductive nanowires of thickness $t_{si}$ alternated with insulating nanowires of thickness $(t_{sp}-t_{si})$ wherein $t_{sp}$ is a width of a pair of the conductive and insulating nanowires, so as to obtain, at each realization of one of the conductive nanowires of a given order n, a filling or a completion of the filling of a corresponding one of the recesses of the same order by a respective elbow-like portion of said conductive nanowire, and the partial filling together with the conductive and insulating nanowires of lower order already realized, of the recesses of greater order by means of respective notched profile portions, thereby forming said nanometric circuit architecture;
    c) realizing, above said nanometric circuit architecture, an insulating layer;
    d) opening, in said insulating layer, n windows, each window being open substantially in correspondence with a respective one of the recesses, with exposure of at least part of the elbow-like portion of a respective one of the conductive nanowires present in said recess; and
    e) realizing, above said insulating layer, n conductive dies addressed towards said standard electronic components, the conductive dies respectively overlapping in correspondence with the respective windows to respective exposed parts of the respective elbow-like portions of the respective conductive nanowires with obtainment of n contacts realizing said electric connection.

2. The method according to claim 1, wherein said depth $a_n$ and said width $b_n$ of said seed layer are linked to said thickness $t_{si}$ and $(t_{sp}-t_{si})$ of said nanowires respectively conductive and insulating, by the relation $a_n \geq (n-1)t_{sp}+a_0$ and $b_n=2t_{si}+2(n-1)t_{sp}$.

3. The method according to claim 1, wherein said n windows have size in a depth direction and in a direction of the width of said recesses equal to $a_0$.

4. The method according to claim 1, wherein said n windows are opened by a technique that is either electronic lithography or imprint lithography.

5. The method according to claim 4, wherein $a_0$ corresponds to the smallest size definable by the technique used for the opening of said windows.

6. The method according to claim 1, wherein $a_0$ is comprised between 2 nm and 60 nm.

7. The method according to claim 6, wherein $a_0$ is comprised between 5 nm and 20 nm.

8. The method according to claim 1, wherein said seed layer is realized by a lithographic technique chosen among extreme ultraviolet, deep ultraviolet, electronic, and imprint lithography.

9. The method according to claim 7, wherein said imprint lithography comprises Soft Lithography, Nano-Imprint Lithography, Step-and-Flash Imprint Lithography, and Superlattice Nanowire Pattern.

10. The method according to claim 1, wherein said seed layer is realized by a S"PT technique.

11. The method according to claim 1, wherein $b_0$ is lower than 60 nm.

12. The method according to claim 11, wherein $b_0$ is comprised between 10 nm and 30 nm.

13. The method according to claim 1, wherein the thickness $t_{si}$ of said conductive nanowires is comprised between 5 nm and 60 nm.

14. The method according to claim 13, wherein the thickness $t_{si}$ of said conductive nanowires is comprised between 5 nm and 30 nm.

15. The method according to claim 1, wherein the thickness $t_{sp}$ of each pair of consecutive conductive and insulating nanowires is lower than 90 nm.

16. The method according to claim 15, wherein the thickness $t_{sp}$ of each pair of consecutive conductive and insulating nanowires is comprised between 10 nm and 50 nm.

17. The method according to claim 1, wherein said conductive nanowires are of polysilicon.

18. The method according to claim 1, wherein said insulating nanowires are of silicon oxide.

19. A method comprising:
    forming, above a semiconductor substrate, a seed layer having a notched wall extending transversely with respect to a top surface of the substrate, the wall defining a first recess extending into the seed layer and having a height equal to a thickness of the seed layer;
    forming a first conductive nanowire in contact with the notched wall, the first conductive nanowire having a contact portion that extends into the first recess and covers opposite sidewalls and a bottom of the first recess;
    forming a first insulating nanowire in contact with a sidewall of the first conductive nanowire;
    forming an insulating layer on the contact portion of the first conductive nanowire;
    opening, in the insulating layer, a first window substantially in correspondence with the contact portion of the first conductive nanowire; and
    forming a first conductive die on the insulating layer, the first conductive die including a conductive contact that extends into the first window and contacts the contact portion of the first conductive nanowire.

20. The method of claim 19, wherein the notched wall defines a second recess extending into the seed layer and having a height equal to the thickness of the seed layer, the first conductive nanowire extends into the second recess and contacts sidewalls of the second recess, and the second insulating nanowire extends into the second recess and contacts sidewalls of the first conductive nanowire.

21. The method of claim 20, further comprising:
    forming a second conductive nanowire in contact with a sidewall of the first insulating nanowire, the second conductive nanowire having a contact portion that extends into the second recess and fills the second recess, the insulating layer being formed on the contact portion of the second conductive nanowire;

forming a second insulating nanowire in contact with a sidewall of the second conductive nanowire;

opening, in the insulating layer, a second window substantially in correspondence with the contact portion of the second conductive nanowire; and forming a second conductive die on the insulating layer, the second conductive die including a conductive contact that extends into the second window and contacts the contact portion of the second conductive nanowire.

22. The method of claim 21, wherein the first and second recesses are spaced apart by a distance comprised between 10 nm and 30 nm.

23. The method of claim 19, wherein the first window is opened by a technique that is either electronic lithography or imprint lithography.

24. The method of claim 19, wherein the contact portion of the first conductive nanowire has a width comprised between 2 nm and 60 nm.

25. The method of claim 19, wherein the first window has a width comprised between 2 nm and 60 nm.

26. The method of claim 19, wherein the seed layer is formed by a lithographic technique.

27. The method of claim 19, wherein the seed layer is formed by a Multi-spacer Patterning Technology (S"PT).

* * * * *

UNITED STATES PATENT AND TRADEMARK OFFICE
CERTIFICATE OF CORRECTION

| | | |
|---|---|---|
| PATENT NO. | : 7,605,066 B2 | Page 1 of 1 |
| APPLICATION NO. | : 11/482513 | |
| DATED | : October 20, 2009 | |
| INVENTOR(S) | : Cerofolini et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 461 days.

Signed and Sealed this

Fifth Day of October, 2010

David J. Kappos
*Director of the United States Patent and Trademark Office*